(12) United States Patent
Yoshida et al.

(10) Patent No.: US 8,723,320 B2
(45) Date of Patent: May 13, 2014

(54) POWER MODULE AND MANUFACTURING METHOD THEREOF

(75) Inventors: Isamu Yoshida, Fujisawa (JP); Michiaki Hiyoshi, Yokohama (JP); Takehide Yokozuka, Yokohama (JP); Akihiro Muramoto, Kai (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/537,116

(22) Filed: Jun. 29, 2012

(65) Prior Publication Data

US 2013/0049201 A1    Feb. 28, 2013

(30) Foreign Application Priority Data

Aug. 31, 2011  (JP) .................. 2011-189574

(51) Int. Cl.
*H01L 23/48*   (2006.01)

(52) U.S. Cl.
USPC .......................................... 257/750

(58) Field of Classification Search
USPC .......................................... 257/750
See application file for complete search history.

(56) References Cited

U.S. PATENT DOCUMENTS

| | | | |
|---|---|---|---|
| 3,662,454 A | 5/1972 | Miller | |
| 6,573,459 B2 * | 6/2003 | Baker et al. | 174/260 |
| 2008/0169537 A1 | 7/2008 | Kajiwara et al. | |
| 2010/0206632 A1 | 8/2010 | Ikeda et al. | |

FOREIGN PATENT DOCUMENTS

| | | | |
|---|---|---|---|
| JP | 2006-179958 A | | 7/2006 |
| JP | 2007-67342 A | | 3/2007 |
| JP | 2008-117825 A | | 5/2008 |
| JP | 2008-235651 A | | 10/2008 |
| JP | 2010-40714 A | | 2/2010 |
| JP | 2010-82668 A | | 4/2010 |
| JP | 2010-212645 A | | 9/2010 |
| JP | 2011-61105 A | | 3/2011 |
| JP | 2011061105 A | * | 3/2011 |
| JP | 2011159933 A | * | 8/2011 |

OTHER PUBLICATIONS

European extended Search Report dated Mar. 3, 2013 (six (6) pages).

* cited by examiner

*Primary Examiner* — Anthony Ho
(74) *Attorney, Agent, or Firm* — Crowell & Moring LLP

(57) ABSTRACT

A power module includes a substrate having a surface on which a plurality of wiring patterns are formed, a semiconductor device mounted on the substrate and electrically connected to a part of the plurality of wiring patterns, and a terminal portion with a lead electrically connected to the other part of the plurality of wiring patterns, and is configured that the lead of the terminal portion is formed by laminating a plurality of metal members which contain a material substantially the same as or softer than the material for forming the other part of wiring patterns, and the material of the plurality of metal members, which is the same as or softer than the material for forming the other part of wiring patterns is electrically connected to the other part of wiring patterns through ultrasonic bonding.

6 Claims, 4 Drawing Sheets

POWER MODULE AND MANUFACTURING METHOD THEREOF

INCORPORATION BY REFERENCE

The present application claims priority from Japanese application serial No. 2011-189574, filed on Aug. 31, 2011, the entire contents of which are hereby incorporated by reference into this application.

BACKGROUND

The present invention relates to a power module which connects leads through ultrasonic bonding, and a manufacturing method of the power module.

A generally employed power module is configured by forming a wiring pattern formed of copper or the like on an insulated substrate formed of ceramics, and allowing a plurality of semiconductor devices to be mounted and stored in the module. For the thus configured power module, a wire bonding is used for connecting the electrode of the semiconductor device and the wiring pattern, the wiring patterns, and the wiring pattern and an external connection lead. The method for bonding a plurality of wires in parallel so as to apply high current has been disclosed in Japanese Patent Application Laid-Open Publication No. 2007-67342.

The recently introduced method uses a plate-like lead capable of reducing a region occupied by connection to be smaller than the region upon wire bonding in compliance with demands of a compact power module. The method of connecting the plate-like lead using ultrasonic waves has been introduced. For ultrasonic bonding (ultrasonic connection) of the plate-like lead is disclosed in, for example, Japanese Patent Application Laid-Open Publication Nos. 2010-40714, 2010-82668, 2010-212645, and 2011-61105.

In the method of performing ultrasonic bonding of the plate-like lead, the lead is placed on the wiring pattern, and presses the lead from above by applying a predetermined load using a bonding tool for horizontal ultrasonic vibration at a predetermined frequency. This makes it possible to allow bonding by removing stain and oxidized film on the metal surface under the load and ultrasonic vibration (amplitude).

In compliance with demand of high current application, the region of connection between the wiring pattern and the lead has been increased. The larger connection region demands increase in the pressing load and amplitude of the ultrasonic vibration for the purpose of achieving improved bonding, which may in turn have possibilities of damage to the insulated substrate.

Japanese Patent Application Laid-Open Publication No. 2010-40714 discloses the art of preventing damage to the insulated substrate. More specifically, each of the bonding member and bonded member contains copper as a main component, and a tin layer which contains tin as a main component is interposed between bonded surfaces of the bonding member and the bonded member. In the aforementioned structure, the bonding member is subjected to the ultrasonic vibration at a room temperature in press contact with the bonded member while having the tin layer interposed between those members.

Japanese Patent. Application Laid-Open Publication No. 2010-82668 discloses the structure for alleviating the force upon the ultrasonic bonding by providing the resin layer between an end portion of a terminal and the wiring.

Japanese Patent Application Laid-Open Publication No. 2010-212645 discloses provision of a thin buffer metal layer that is soft or exhibits high slidability between an end of the terminal and an electrode pad for the purpose of preventing abrasion and crack in the pad caused by the end of the terminal during ultrasonic bonding.

Japanese Patent Application Laid-Open Publication No. 2011-61105 discloses the coating layer formed on the pad, which is harder than the pad and the lead terminal. The coating layer will be destroyed during the ultrasonic bonding so that the lead terminal and the pad are bonded through plastic flow.

With the method disclosed in Japanese Patent Application Laid-Open Publication No. 2010-40714 for ultrasonic bonding of the plate-like lead, the material for forming the bonding member (lead) and the bonded member (substrate wiring pattern) is limited to copper. Combination with the other material for forming those members is not considered.

The process having the tin layer formed between the bonding surfaces for bonding is employed. The tin layer partially remains although most part of such tin layer is dispersed in the copper. There may be a case that the power module is brought into a high temperature state depending on the subsequent manufacturing inspection process, usage environment, or service condition. The power module in the high temperature state may soften the partially remained tin layer on the bonding surface to deteriorate strength of the interfacial bonded surface.

With the method disclosed in Japanese Patent Application Laid-Open Publication No. 2010-82668, the resin layer provided between the end of the terminal and the wiring is separated through the ultrasonic bonding, and further spread between the terminal and the wiring. This may reduce the intermetallic contact region between the terminal and the wiring, leading to increase in the electric resistance of the connection portion.

With the method disclosed in Japanese Patent Application Laid-Open Publication No. 2010-212645, the buffer metal layer may prevent abrasion and crack in the pad in the initial stage of the ultrasonic bonding. However, there is no consideration described with respect to prevention of the abrasion and crack in the pad at the portion with no buffer metal layer when the contact region between the pad and the electrode becomes large. With the method disclosed in Japanese Patent Application Laid-Open Publication No. 2011-61105, the lead terminal and the pad are connected through plastic flow at the portion where the coating layer formed on the pad, which is harder than the pad and the lead terminal is cracked. When the contact region between the pad and the electrode becomes large, the coating layer that remains between the pad and the lead terminal prevents metal bonding between the pad and the lead terminal. This may increase connection resistance between the pad and the lead terminal, and may further deteriorate connection reliability.

SUMMARY

The present invention provides a power module capable of performing improved ultrasonic bonding of metals of the wiring pattern and lead while covering a wide region without damaging the insulated substrate during the ultrasonic bonding, and a manufacturing method of the power module.

The present invention provides a power module which includes a substrate having a surface on which a plurality of wiring patterns are formed, a semiconductor device mounted on the substrate and electrically connected to a part of the plurality of wiring patterns, and a terminal portion with a lead electrically connected to the other part of the plurality of wiring patterns formed on the substrate. It is configured that the lead of the terminal portion is formed by laminating a plurality of metal members which contain a material substantially the same as or softer than the material for forming said the other part of the wiring patterns, and the material of the laminated plurality of metal members, which is the same as or softer than the material for forming the other part of wiring patterns is electrically connected to said the other part of wiring patterns through ultrasonic bonding.

The present invention provides a method of manufacturing a power module in which a semiconductor device is mounted on a substrate having a surface on which a plurality of wiring patterns are formed, and the semiconductor device is electrically connected to a part of the plurality of wiring patterns, the method including a step of electrically connecting a lead of a terminal portion to the other part of the plurality of wiring patterns formed on the substrate. With the method, the lead of the terminal portion is formed by laminating a plurality of metal members which contain a material that is the same as or softer than the material for forming said the other part of wiring patterns. And with the method, the step of electrically connecting the lead of the terminal portion is carried out in a state where the material of the plurality of metal members, which is the same as or softer than the material for forming said the other part of wiring patterns is in contact with said the other part of wiring patterns, the lead of the terminal portion and said the other part of wiring patterns are ultrasonic bonded to electrically connect the lead of the terminal portion to said the other part of wiring patterns.

The present invention allows bonding over a wide region in compliance with the demand of high current application while preventing damage to the insulated substrate, and is capable of preventing decrease in strength of the bonded portion by increasing the temperature.

These features and advantages of the invention will be apparent from the following more particular description of preferred embodiments of the invention, as illustrated in the accompanying drawings.

DESCRIPTION OF THE PREFERRED EMBODIMENTS

Figure 1:
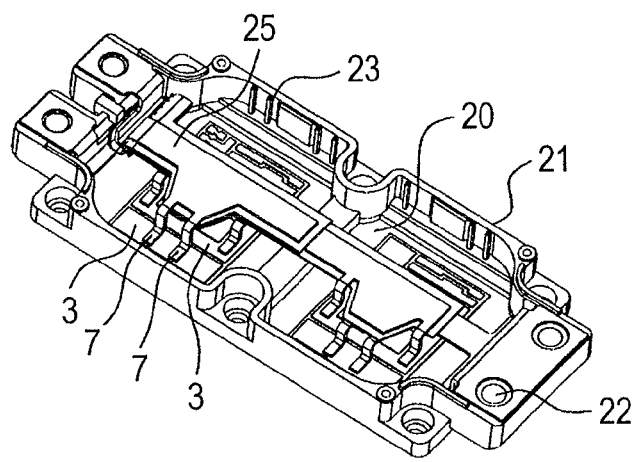
FIG. 1 is an exemplary perspective view of a power module.

Embodiments of the present invention will be described referring to the drawings.

First Embodiment

FIG. 1 is a perspective view of a power module 100 according to the first embodiment. Referring to the drawing, a base 20 is formed of a metal material with high heat conductivity, for example, aluminum, copper and copper alloy in view of radiation performance. A case 21 is formed of a plastic material suitable for the process of its complicated shape. The base 20 and the case 21 are fixed with a screw or an adhesive agent. A substrate 3 is mounted on the base 20, on which a terminal portion 25 with a plurality of leads 7 is provided. The leads 7 of the terminal portion 25 are connected to the substrate 3 through ultrasonic bonding. The case 21 has screw holes 22 for connection to an external terminal (not shown) as well as a signal lead 23.

Figure 2:
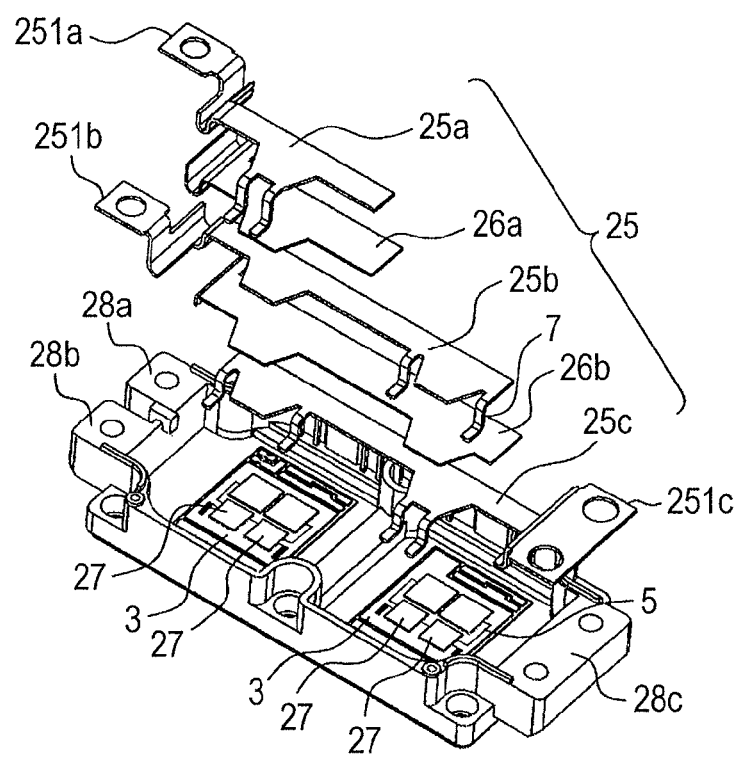
FIG. 2 is an exemplary development view of the power module.

FIG. 2 is an exemplary exploded view of the power module 100 described referring to FIG. 1. The terminal portion 25 is formed of three terminal members, that is, a positive electrode connection terminal 25a, a negative electrode connection terminal 25b, and an alternating current connection terminal 25c. Insulation members 26a and 26b are interposed between the respective terminal members so as to establish insulated states, respectively. Each of the insulation members 26a and 26b has substantially a larger size than each size of the respective terminal members 25a, 25b, and 25c in view of pressure resistance, and is formed of a non-woven fabric or a plastic. A wiring pattern 5 is formed on the substrate 3, on which a plurality of semiconductor devices 27 are mounted. Generally, a large number of wires are used for electrically connecting the wiring pattern 5, the semiconductor device 27 and the signal lead 23. However, they are not shown in the drawing for simplification. In most of the cases, an aluminum material with diameter ranging from 0.3 to 0.5 mm is used for forming the wire.

A positive electrode connection portion 251a is formed at an end of the positive electrode connection terminal 25a, and connected to a not shown external terminal at a positive electrode connection terminal portion 28a incorporated into the case 21 as shown in FIG. 1. A negative electrode connection portion 251b is formed at an end of the negative electrode connection terminal 25b, and connected to a not shown external terminal at a negative electrode connection terminal portion 28b incorporated into the case 21 as shown in FIG. 1. An alternating current connection portion 251c is formed at an end of the alternating current connection terminal 25c, and connected to a not shown external terminal at an alternating current connection terminal portion 28c incorporated into the case 21 as shown in FIG. 1.

A structure of the connection portion between the lead of the terminal portion 25 and the wiring pattern 5 formed on the substrate 3 in the power module 100 shown in FIGS. 1 and 2 will be described referring to FIGS. 3A to 3C.

Figure 3A:
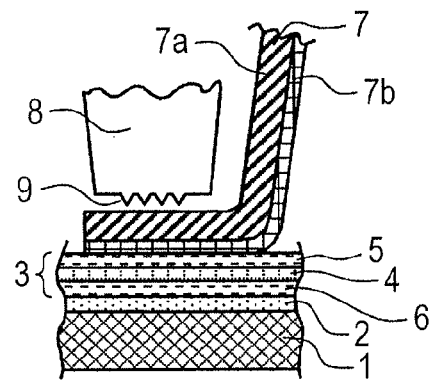
FIG. 3A is an exemplary sectional view of a region around a bonded portion of a lead of the power module before ultrasonic bonding performed in the power module according to a first embodiment.

FIG. 3A is an exemplary sectional view of a region around an ultrasonic bonded portion of the power module 100 according to the embodiment, which is mounted on a not shown anvil as a receptacle fitting for an ultrasonic connection machine.

The substrate 3 is connected onto a base 1 with a solder 2, said base 1 corresponds to the base 20 described referring to FIGS. 1 and 2. The substrate 3 includes an insulated substrate 4 formed of ceramics, a metal pattern 6 bonded to the solder 2 at one surface side of the insulated substrate 4, and a wiring pattern 5 formed of copper provided at the other surface side, that is, the surface of the insulated substrate 4 opposite the one on which the metal pattern 6 is formed. The metal pattern 6 is bonded to the base 1 with the solder 2 so that it is formed on relatively a wide region or a whole surface of the insulated substrate 4 at the side that faces the base 1. The lead 7 of either the positive electrode connection terminal 25a, the negative electrode connection terminal 25b, or the alternating current connection terminal 25c is bonded onto the copper wiring pattern 5.

Two types of plates, that is, a material A (7a) and a material B (7b) are laminated for forming the lead 7. The material B (7b) is deformable as it has smaller hardness than that of the material A (7a). The volume ratio of the material A (7a) with high heat conductivity, which constitutes the lead 7 is made high in view of radiation performance. The material A (7a) is configured to have the thickness of at least the portion in contact with the wiring pattern 5 of the lead 7 made substantially the same as or larger than that of the corresponding portion of the material B (7b). For example, the material A (7a) formed of copper or copper alloy may be combined with the material B (7b) formed of a material softer than the copper for forming the wiring pattern 5, for example, aluminum, or aluminum alloy.

Figure 3B:
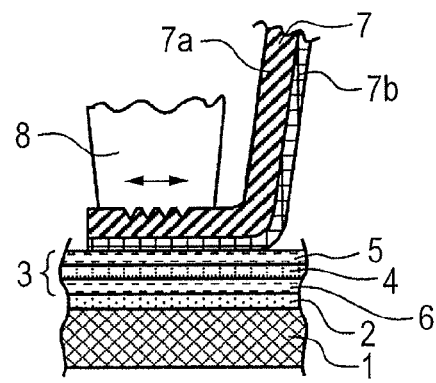
FIG. 3B is an exemplary sectional view of the region around the bonded portion of the lead of the power module during the ultrasonic bonding performed in the power module according to the first embodiment.

In the aforementioned state, a tool 8 of the ultrasonic bonding machine (not shown) is used to pressurize the upper surface of the lead 7 at the load ranging from 100 to 400 N so as to generate ultrasonic vibration (amplitude: 10-70 µm) in a horizontal direction (arrow direction of FIG. 3B). Bonding is performed under the load and the ultrasonic vibration (amplitude) by removing stain and oxide film on the metal surface. A plurality of pyramid-like protruding portions 9 are formed on a leading end of the tool 8 so as to transfer the vibration from a transducer (not shown) of the ultrasonic bonding machine to the lead 7 without causing slip. The protruding portions 9 are pressurized and dug into the lead 7 by the tool 8. This makes it possible to efficiently transfer the vibration to the lead 7 without causing slip.

In this state, atomic diffusion is induced at the interface between the lead 7 to which the ultrasonic vibration is applied under pressure of the tool 8 and the wiring pattern 5 on the substrate 3 mounted on the anvil, against which the lead 7 is pressed to diffuse atoms at both sides of the material B (lead 7b) and the wiring pattern 5 mutually, causing an intermetallic atomic binding. Then a diffusion layer 71 is formed at the interface between the material B (lead 7b) and the wiring pattern 5 as shown in FIG. 3C.

The diffusion layer 71 is formed at the interface between the wiring pattern 5 formed of copper and the material B (lead 7b) formed of the material softer than the one for forming the wiring pattern 5, for example, aluminum or aluminum alloy. The resultant diffusion layer 71 may be formed at the pressure lower than the pressure at which the diffusion layer is formed at the interface between the material A (lead 7a) and the wiring pattern 5. This may ensure connection between the lead 7 and the wiring pattern 5 without damaging the substrate 3.

The material with relatively high melting point, for example, aluminum or aluminum alloy is used for forming the material B (lead 7b) to ensure stable bonding strength to be kept for a prolonged time without softening the bonded portion.

At a certain period of time has elapsed from the start of the ultrasonic bonding by applying ultrasonic vibration while pressing the lead 7 by the tool 8, application of the ultrasonic vibration is stopped to complete the ultrasonic bonding between the lead 7 and the wiring 5 on the substrate 3. Since the ultrasonic bonding proceeds with progression of deformation of the lead 7, end point of the ultrasonic vibration application may be detected based on displacement of the tool 8. Bonding energy derived from the applied pressure, applied frequency and amplitude is monitored. When the bonding energy reaches a predetermined amount, bonding is stopped so as to detect the end point of the ultrasonic bonding.

When detecting the end point of the ultrasonic bonding and stopping application of the ultrasonic vibration through any one of the aforementioned methods, application of pressure to the lead 7 against the wiring pattern 5 by the tool 8 is stopped. Then, as shown in FIG. 3C, the tool 8 is lifted away from the wiring pattern 5 to end the ultrasonic bonding step.

Figure 4:
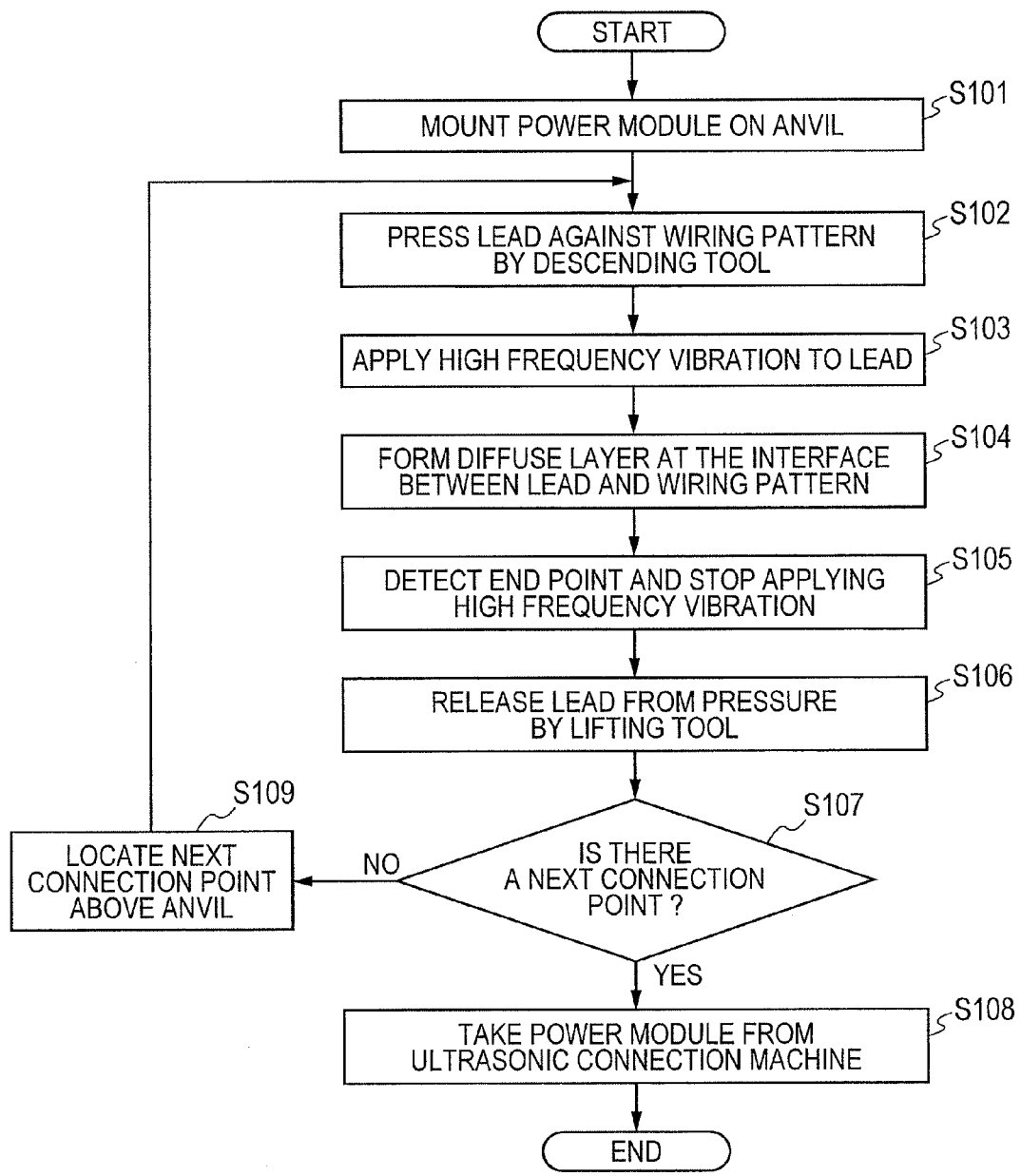
FIG. 4 is a flowchart which represents process steps of the ultrasonic bonding performed in the power module according to the first embodiment.

The process steps of the aforementioned operation will be described referring to FIG. 4.

The power module 100 having the respective leads 7 of the terminal portion 25 placed on the wiring pattern 5 of the substrate 3 is mounted on the anvil for the ultrasonic connection machine (not shown) in S101. Then the tool 8 of the ultrasonic connection machine (not shown) descends to press the surface of the lead 7, specifically, the material B (lead 7b) of the terminal portion 25 against the wiring pattern 5 in S102. The ultrasonic vibration is generated by the ultrasonic connection machine (not shown) so as to be applied to the lead 7 while having its surface pressurized against the wiring pattern 5 in S103. The ultrasonic vibration is applied in the state where the surface of the lead 7 of the terminal portion 25, that is, the material B (lead 7b) is pressed against the wiring pattern 5. Then the diffuse layer is formed at the interface between the material B (lead 7b) and the wiring pattern 5 in S104. The end point of the ultrasonic bonding is detected to stop application of the ultrasonic vibration in S105. The end point is detected through any one of the aforementioned three methods.

The tool 8 is lifted up to release the lead 7 from pressure in S106. It is further checked for any point to be connected between the lead 7 and the wiring pattern 5 of the power module 100 in S107. If no point to be connected is left, the power module 100 having the ultrasonic bonding between the lead 7 and the wiring pattern 5 completed is taken from the anvil for the ultrasonic connection machine (not shown) in S108 to end a series of operations. Meanwhile, if the point to be connected between the lead 7 and the wiring pattern 5 of the power module 100 is left, a not shown handling device is used to adjust the position of the power module 100 in S109 so that the point at which the lead 7 and the wiring pattern 5 are not connected is located above the anvil. Then the process is executed from S102.

Figure 3C:
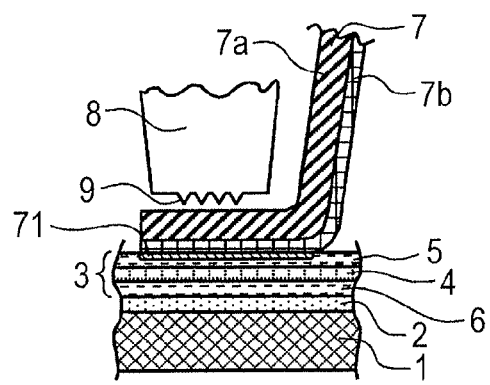
FIG. 3C is an exemplary sectional view of the region around the bonded portion of the lead of the power module after the ultrasonic bonding performed in the power module according to the first embodiment.

In the described referring to FIGS. 3A to 3C, the lead 7 is formed by laminating the plates of the material A (lead 7a) and the material B (lead 7b). However, the laminated structure may be formed by plating the material B (lead 7b) onto the material A (lead 7a).

The aforementioned structure allows a wide bonding region while preventing damage to the insulated substrate by coping with the deformable bonding surface of the lead and higher current application. Decrease in the strength of the bonded portion may also be prevented by increasing the temperature.

Second Embodiment

An example of a structure of the lead will be described.

Figure 5:
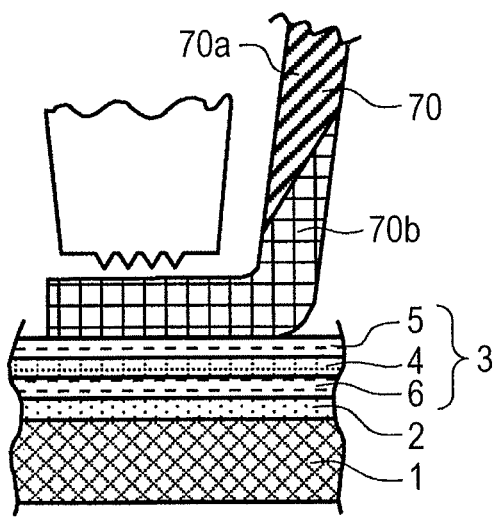
FIG. 5 is an exemplary sectional view of a region around the ultrasonic bonded portion of a power module according to a second embodiment.

FIG. 5 is an exemplary sectional view of a region around the ultrasonic bonded portion of the power module according to the embodiment.

Two kinds of plates are used for forming a lead 70, that is, a region around the bonded portion is formed of a material B (lead 70b), and the other region is formed of a material A (lead 70a). The material B (lead 70b) is deformable as it has smaller hardness than that of the material A (lead 70a). The volume ratio of the material A (lead 70a) in the lead 7 is higher than that of the material B (lead 70b) in view of radiation performance, since the material A (lead 70*a*) has a high heat conductivity comparing to that of the material B (lead 70*b*).

The above-described structure allows the wider bonding region by coping with deformable bonded surface of the lead and high current application while preventing damage to the insulated substrate. The above-described structure also prevents decreasing in the strength of the bonded portion when increasing the temperature. Compared with the case according to the first embodiment, digging property of the tool is improved, thus further stabilizing bonding performance.

The present invention is not limited to the embodiments as described above, but includes various types of modified examples. For example, the aforementioned embodiments have been described in detail for the purpose of easy comprehension. However, the present invention is not limited to the structure provided with all the elements as described above.

A part of the structure of the respective embodiments allows addition, deletion and replacement of the other structure.

Any type of materials may be used without being limited to the combination of materials as described in the embodiment so long as they satisfy the conditions of the embodiment.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

The invention claimed is:

1. A power module comprising:
   a substrate having a surface on which a plurality of wiring patterns are formed;
   a semiconductor device mounted on the substrate and electrically connected to some of the plurality of wiring patterns; and
   a terminal portion with a lead electrically connected to the other of the plurality of wiring patterns formed on the substrate; wherein:
   the lead of the terminal portion is formed by a plurality of metal members which contain a first material substantially the same as or lower in hardness than a second material forming the other of the wiring patterns; and
   the lead of the terminal portion is electrically connected to the other of the wiring patterns through ultrasonic bonding, such that a diffusion layer is formed between the first material and the second material that ensures connection between the lead and the other of the wiring patterns without damaging the substrate.

2. The power module according to claim 1, wherein the lead is formed by laminating a plurality of metal layers.

3. The power module according to claim 1, wherein a hardness of the metal member of those laminated to form the lead at a side bonded to the other part of the wiring patterns is lower than a hardness of the other metal member.

4. The power module according to claim 1, wherein:
   the lead has a structure formed by laminating a member formed of copper as a main component and a member formed of aluminum as a main component;
   the other part of the wiring patterns is formed of copper; and
   the member formed of aluminum as the main component is electrically connected to the other part of wiring patterns through ultrasonic bonding.

5. A method of manufacturing a power module in which a semiconductor device is mounted on a substrate having a surface on which a plurality of wiring patterns are formed, and the semiconductor device is electrically connected to some of the plurality of wiring patterns, the method including a step of electrically connecting a lead of a terminal portion to the other of the plurality of wiring patterns formed on the substrate,
   wherein the lead of the terminal portion is formed by a plurality of metal members which contain a first material that is the same as or lower in hardness than a second material forming the other part of the wiring patterns; and
   wherein the step of electrically connecting the lead of the terminal portion is carried out in a state where one of the plurality of metal members, is in contact with the other of the wiring patterns, and the lead of the terminal portion is electrically connected to the other of the wiring patterns through ultrasonic bonding, such that a diffusion layer is formed between the first material and the second material that ensures connection between the lead and the other of the wiring patterns without damaging the substrate.

6. The method of manufacturing a power module according to claim 5, wherein:
   the lead is structured by laminating a member formed of copper as a main component and a member formed of aluminum as a main component;
   the other part of wiring patterns is formed of copper; and
   the member formed of aluminum as the main component is electrically connected to the other part of wiring patterns through ultrasonic bonding.

* * * * *